United States Patent
Tsao et al.

(10) Patent No.: US 8,367,553 B2
(45) Date of Patent: Feb. 5, 2013

(54) METHOD FOR MANUFACTURING THROUGH-SILICON VIA

(75) Inventors: Wei-Che Tsao, Tainan (TW); Wen-Chin Lin, Tainan County (TW)

(73) Assignee: United Microelectronics Corp., Hsinchu (TW)

( * ) Notice: Subject to any disclaimer, the term of this patent is extended or adjusted under 35 U.S.C. 154(b) by 210 days.

(21) Appl. No.: 12/962,055

(22) Filed: Dec. 7, 2010

(65) Prior Publication Data

US 2012/0142190 A1    Jun. 7, 2012

(51) Int. Cl.
*H01L 21/306* (2006.01)
(52) U.S. Cl. .................. 438/692; 257/E21.23
(58) Field of Classification Search .......... 438/692, 438/638, 687, 736, 106; 257/E21.23
See application file for complete search history.

(56) References Cited

U.S. PATENT DOCUMENTS

| 7,531,415 | B2 | 5/2009 | Kwok |
| 2010/0133660 | A1 | 6/2010 | Huyghebaert et al. |
| 2010/0187694 | A1* | 7/2010 | Yu et al. ............ 257/751 |

* cited by examiner

*Primary Examiner* — Duy Deo
*Assistant Examiner* — Mahmoud Dahimene
(74) *Attorney, Agent, or Firm* — Ding Yu Tan

(57) ABSTRACT

A method for manufacturing TSVs comprises following steps: A stack structure having a substrate, an ILD layer and a dielectric stop layer is provided, in which an opening penetrating through the ILD layer and the dialectic stop layer and further extending into the substrate is formed. After an insulator layer and a metal barrier are formed on the stack structure, a top metal layer is formed on the stack structure to fulfill the opening. A first planarization process stopping on the metal barrier is conducted, wherein the first planarization process has a polishing rate for removing the metal barrier less than that for removing the top metal layer. A second planarization process stopping on the dielectric stop layer is conducted, wherein the second planarization process has a polishing rate for removing the insulator layer greater than that for removing the dielectric stop layer. The dielectric stop layer is than removed.

19 Claims, 8 Drawing Sheets

METHOD FOR MANUFACTURING THROUGH-SILICON VIA

BACKGROUND OF THE INVENTION

1. Field of Invention

The present invention relates to a wafer level packaging technology. More particularly, the present invention relates to method for manufacturing Through-Silicon Vias (TSV).

2. Description of Related Art

With the advance of the semiconductor manufacturing technology, more and more devices are integrated into a semiconductor circuit. However, when more devices are involve in a 2-dimensional (2D) semiconductor circuits, it requires more space to accommodate the devices and needs longer wires to connect thereto. Besides, resistance-capacitance (RC) delay may occur and power consumption should be increased significantly, both may adversely affect the performance of the semiconductor circuit.

To resolve these problems, a system-on-chip (SoC) and/or system-in-package (SiP) technology are provided, wherein a 2D or 3-dimensional (3D) packaging structure is adopted to integrate devices in a single die. However, the conventional SoC and/or SiP technology still has drawbacks. Hence the 2D or 3D packaging technology still utilizes bonding wires or contact pads to connect the integrated devices, thus when more and more device is integrated on the die, the size of the die would be significantly increased and the performance thereof should be deteriorated.

Currently, a new 3D packaging technology-TSV is introduced to improve the aforementioned problems, wherein a TSV is an interconnection penetrating through at least one dielectric layer of a wafer or a die to provide an electrical contact to devices vertically aligned with each other and disposed in the wafer or the die. Hence the vertical interconnection can reduce the contact distance, thus the circuit complexity of the package structure would be reduced, meanwhile the line width of the interconnections can be increased. Accordingly the speed of the devices should be enhanced and the power consumption should be reduced.

SUMMARY OF THE INVENTION

One aspect of the present invention is to provide a method for manufacturing TSVs, wherein the method comprises several steps as follows: A stack structure having a substrate, an ILD layer (inter layer dielectric layer) and a dielectric stop layer is provided, in which an opening penetrating through the ILD layer and the dielectric stop layer and further extending into the substrate is formed. After an insulator layer and a metal barrier are formed on the stack structure and the sidewalls of the opening, a top metal layer is then formed on the stack structure to fulfill the opening. A first planarization process stopping on the barrier layer is conducted to remove a portion of the top metal layer, wherein the first planarization process has a polishing rate for removing the metal barrier less than that for removing the top metal layer. A second planarization process stopping on the dielectric stop layer is subsequently conducted to remove a portion of the metal barrier and a portion of the insulator layer, wherein the second planarization process has a polishing rate for removing the insulator layer greater than that for removing the dielectric stop layer. A third planarization process stopping on the ILD layer is subsequently conducted to remove the dielectric stopping layer, wherein the third planarization process has different polishing rate for removing the dielectric stop layer greater than that for removing the ILD layer.

Another aspect of the present invention is to provide a method for manufacturing TSVs, wherein the method comprises several steps as follows: A stack structure having a substrate and an ILD layer is provided, in which an opening penetrating through the ILD layer and further extending into the substrate is formed. After an insulator layer and a metal barrier are formed on the stack structure, a top metal layer is then formed on the stack structure to fulfill the opening. A first planarization process stopping on the metal barrier is conducted to remove a portion of the top metal layer, wherein the first planarization process has a polishing rate for removing the metal barrier less than that for removing the top metal layer. A second planarization process stopping on the insulator layer is subsequently conducted to remove the a portion of the metal barrier, wherein the second planarization process has a polishing rate for removing a portion of the metal barrier greater than that for removing the insulator layer. A third planarization process stopping on the ILD layer is subsequently conducted to remove the insulator layer. After the TSV is formed, at least one other ILD layer other is subsequently formed over the ILD layer to form the semiconductor device.

According to aforementioned embodiment of the present invention, a dielectric stop layer is inserted between a ILD layer and a top metal layer of a stack structure prior to a planarization process for forming a TSV on the stack structure, such that the planarization process can be divided into a plurality of polishing stages. In addition, various polishing slurries having different polishing rates for the planarization stopping layer are associated to determine the end-points of the polishing stages, whereby the polishing thickness and the end-points of the planarization process can be controlled more easily. Accordingly, the polishing uniformity of the TSV and the processing reliability during the wafer level packaging process can be enhanced.

In order to make the aforementioned and other objects, features and advantages of the present invention comprehensible, preferred embodiments accompanied with figures are described in detail below.

DESCRIPTION OF EMBODIMENTS

Figure 1A:
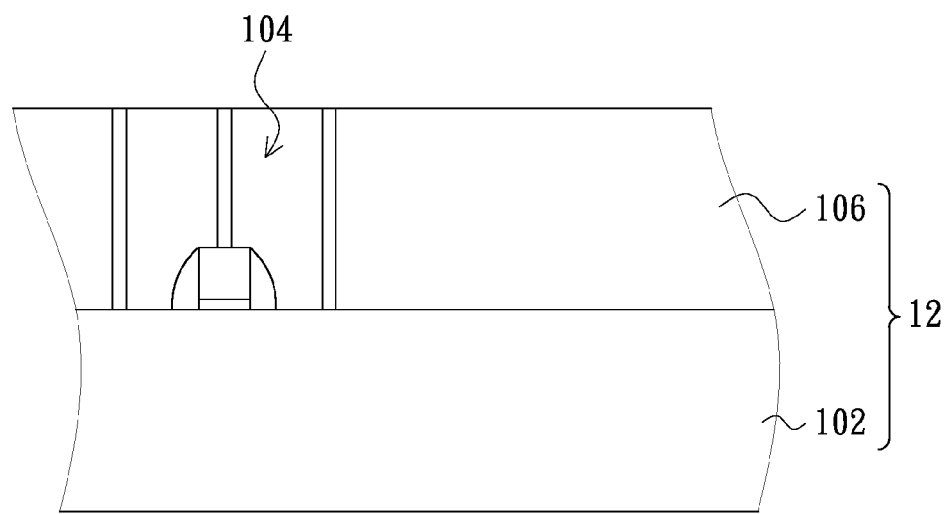
FIGS. 1A to 1F illustrate cross sections of the process for manufacturing a TSV structure in accordance with one embodiment of the present invention.

Detail descriptions of several embodiments eligible to exemplify the features of making and using the present invention are disclosed as follows. It must be appreciated that the following embodiments are just exemplary, but not be used to limit the scope of the present invention. Wherever possible, the same reference numbers are used in the drawings and the description to refer to the same or like parts.

FIGS. 1A to 1F illustrate cross sections of the process for manufacturing a TSV structure 116 in accordance with one embodiment of the present invention. Referring to FIG. 1A, a stack structure 112 having a silicon substrate 102 and an ILD layer 106 is provided. Wherein the ILD layer 106 is formed on the substrate 102, and at least one electronic device 104, such as a conductive wire, a transistor, a diode, a resistor or a capacitor is formed in the ILD layer 106; the ILD layer 106 preferably is a low-k dielectric material or ultra low-k dielectric material consisting of silicon nitride (SiN), silicon oxynitride (SiCN), silicon carbide (SiC), silicon dioxide ($SiO_2$), undoped silicate glass (USG), Tetraethoxysliane (TEOS) or the arbitrary combinations thereof.

Figure 1B:
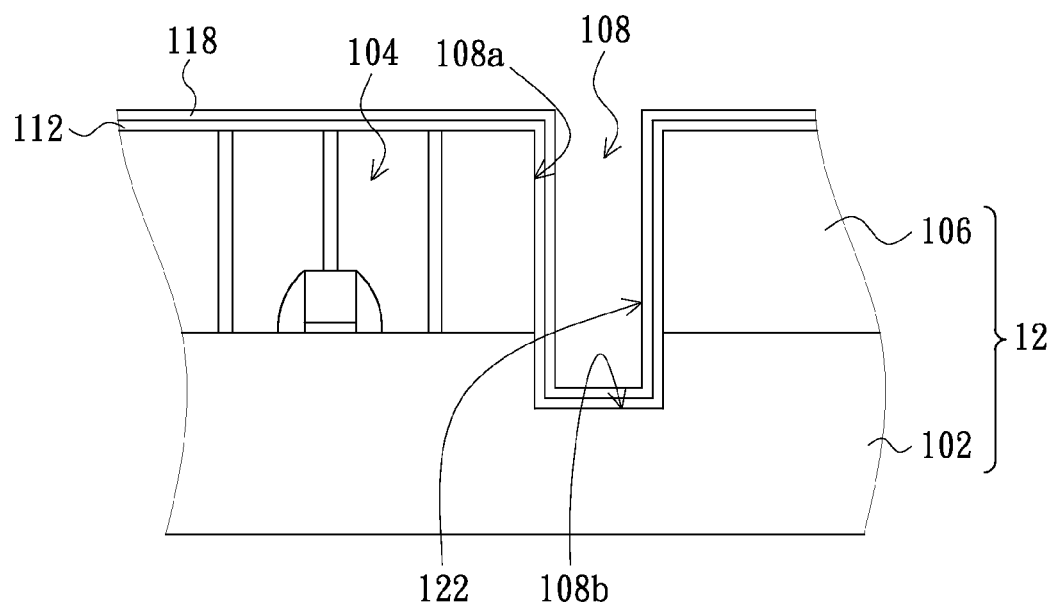

In addition, the stack structure 112 has an opening formed therein. Referring to FIG. 1B, the opening 108 penetrates through the ILD layer 106, and further extends into a portion of the substrate 102. Next, an insulator layer 112 and a metal barrier 118 are formed sequentially on the stack structure 112, and the sidewalls 108b of the opening 108. I some embodiment of the present invention, the metal barrier 118 consists of Titanium nitride (TiN), Titanium (Ti), Tantalum nitride (TaN) or the arbitrary combinations thereof.

Figure 1C:
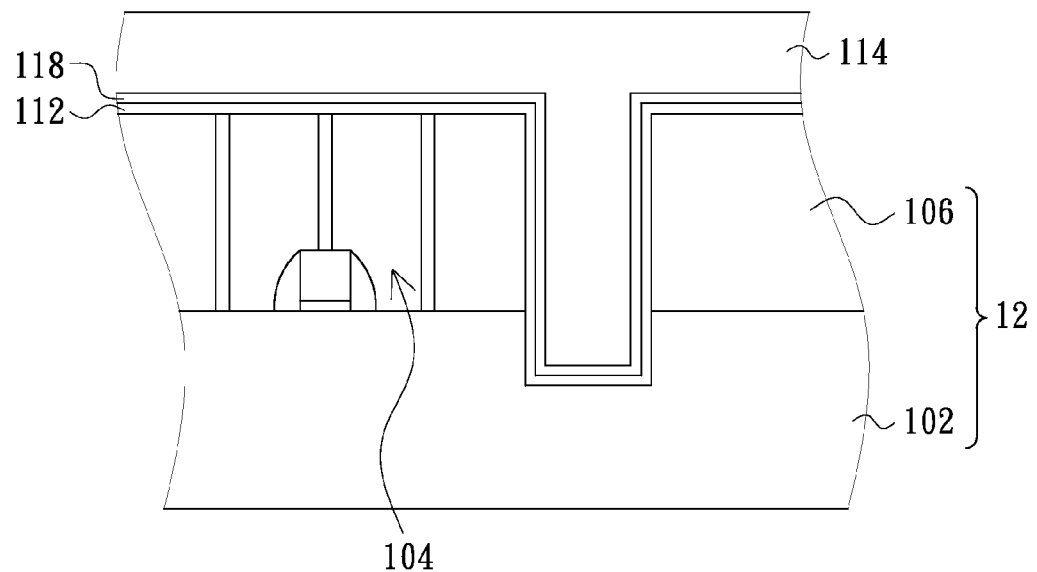
Figure 1D:
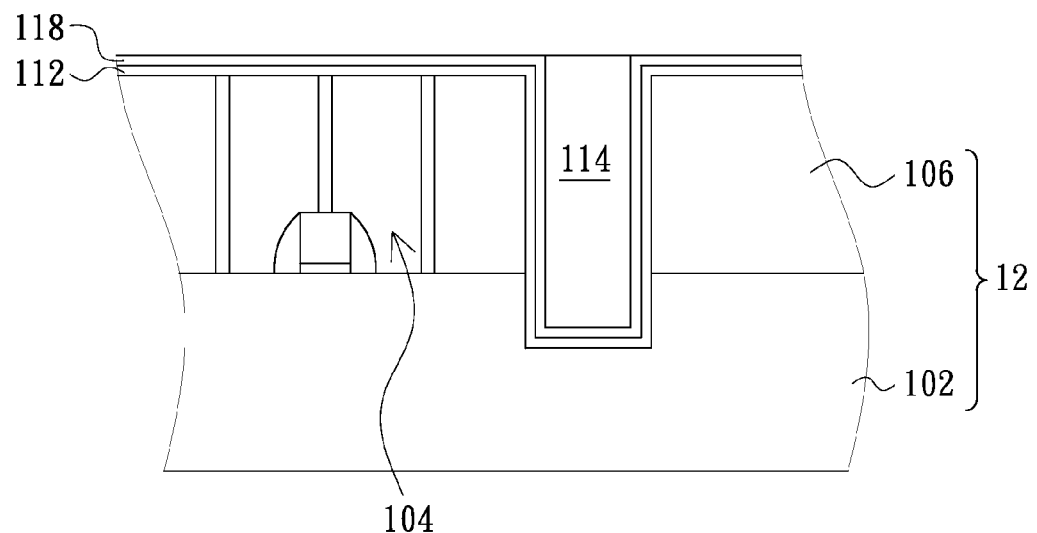
Figure 1E:
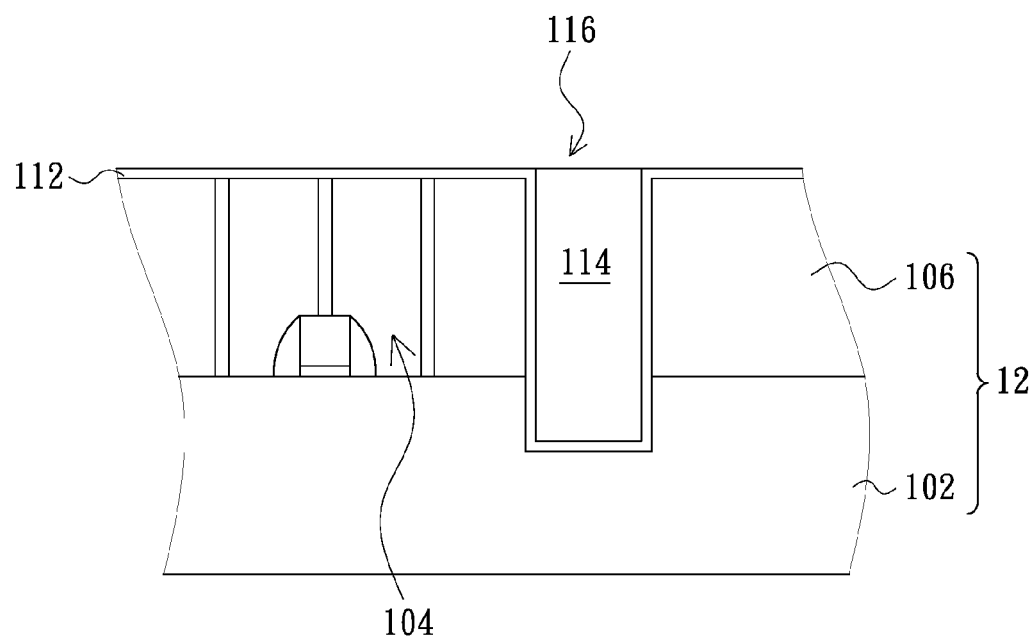
Figure 1F:
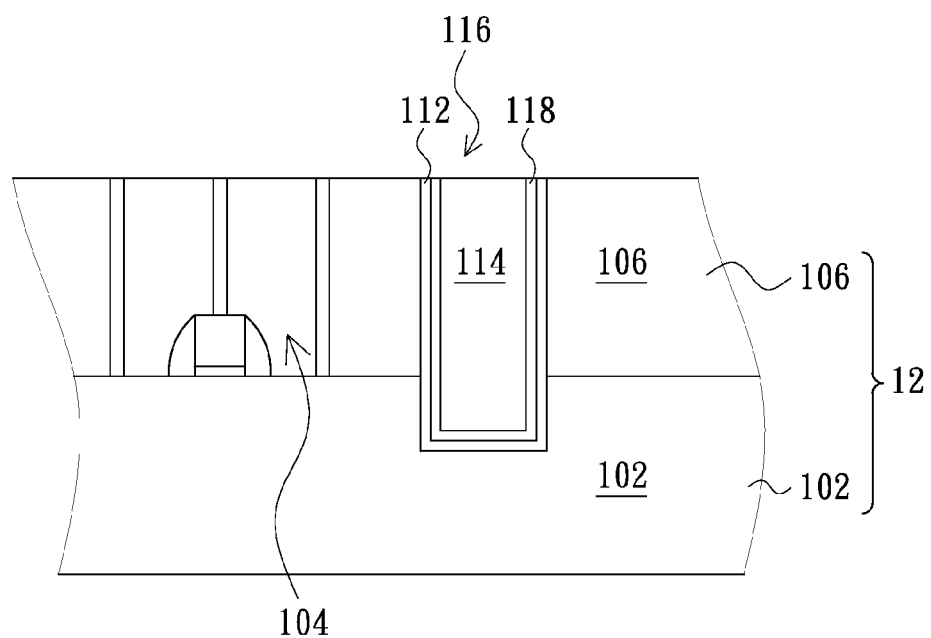

A metal filling process subsequently is conducted on the stack structure 112 to fulfill the opening 108 with a metal, such as copper (Cu) or aluminum (Al), and to form a top metal layer 114 on the metal barrier 118 (shown as FIG. 1C). In some embodiments of the present invention, a seeding deposition 1122 may be conducted on the metal barrier 118 prior the metal filling process.

A first planarization process, for example a CMP process, is then conducted to remove the portion of the top metal layer 114 covering on the metal barrier 118 (shown as FIG. 1D), and the CMP process is then stopped on the metal barrier 118, wherein the slurry of the CMP process has different polishing rates for removing the metal barrier 118 and the top metal layer 114. In the present embodiment, the polishing rate of the first planarization process for removing the metal barrier 118 is less than the polishing rate of the first planarization process for removing the top metal layer 114. Preferably, the ratio of the polishing rate for removing the top metal layer 114 to that for removing the metal barrier 118 is greater than 2. In the present embodiment the ratio is about one hundred or more than one hundred.

Note that, in the embodiments of the present invention, the end point of the CMP process is determined by an In-Situ Rate Monitor (ISRM), thus the CMP process can be manipulated to stop on the metal barrier 118. Generally, at the end point of the CMP process stopping on the metal barrier 118, the CMP slurry can not terminate the polishing reaction immediately, thus still a portion of the metal barrier 118 may be over polished. Because of the metal barrier 118 and the top metal layer 114 has different corrosion resistance, manipulating the different polishing rates for removing the metal barrier 118 and the top metal layer 114 can make the polished metal barrier 118 and the retained top metal layer 114 have an equal level. Hence the ISRM technology has been well known by those skilled in the art, the specification hereinafter will not describe the scheme and operating steps thereof in detail.

A second planarization process, for example an another CMP process, is then conducted to remove portion of the metal barrier 118, a portion of the top metal layer 114, and the CMP process is then stopped on the insulator layer 112 (shown as FIG. 1E), wherein the slurry of the CMP process has different polishing rates for removing the insulator layer 112 and the metal barrier 118. In the present embodiment, the polishing rate of the second planarization process for removing the metal barrier 118 is greater than the polishing rate of the second planarization process for removing the insulator layer 112. Preferably, the ratio of the polishing rate for removing the metal barrier 118 to that for removing the insulator layer 112 is greater than 2.

Subsequently a third planarization process, for example an another CMP process, is conducted to remove a portion of the insulator layer 112, a portion of the metal barrier 118 and a portion of the top metal layer 114 (shown as FIG. 1F), and the CMP process is then stopped on the ILD layer 106 to form the TSV 116, wherein the slurry of the CMP process has different polishing rates for removing the insulator layer 112 and the ILD layer 106. In the present embodiment, the polishing rate of the third planarization process for removing the insulator layer 112 is greater than the polishing rate of the third planarization process for removing the ILD layer 106 (shown as FIG. 1F). Preferably, the ratio of the polishing rate for removing the insulator layer 112 to that for removing the ILD layer 106 is greater than 2.

After the TSV 116 is formed, at least one ILD layer other than the ILD layer 106 are subsequently formed over the ILD layer 106 to form a 3D wafer package structure (not shown).

Figure 2A:
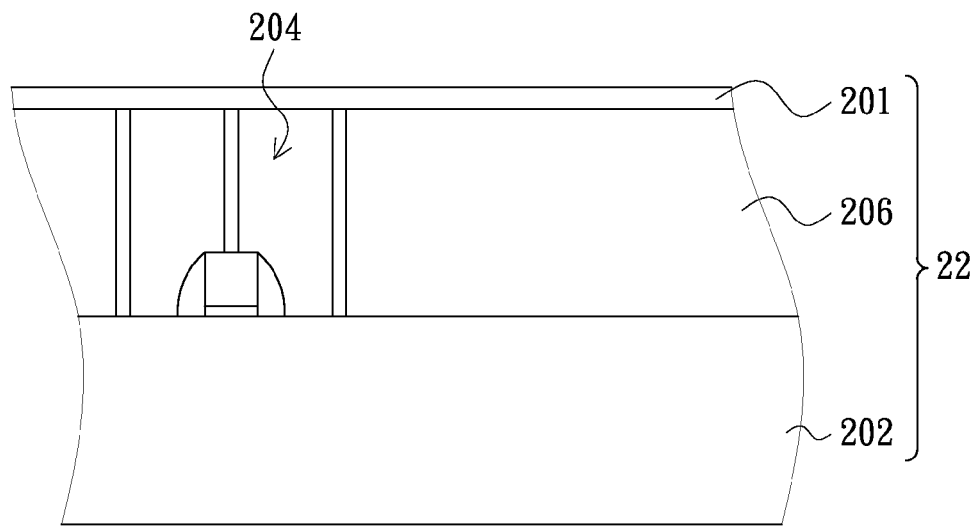
FIGS. 2A to 2G illustrate cross sections of the process for manufacturing a TSV structure in accordance with another embodiment of the present invention.
Figure 2B:
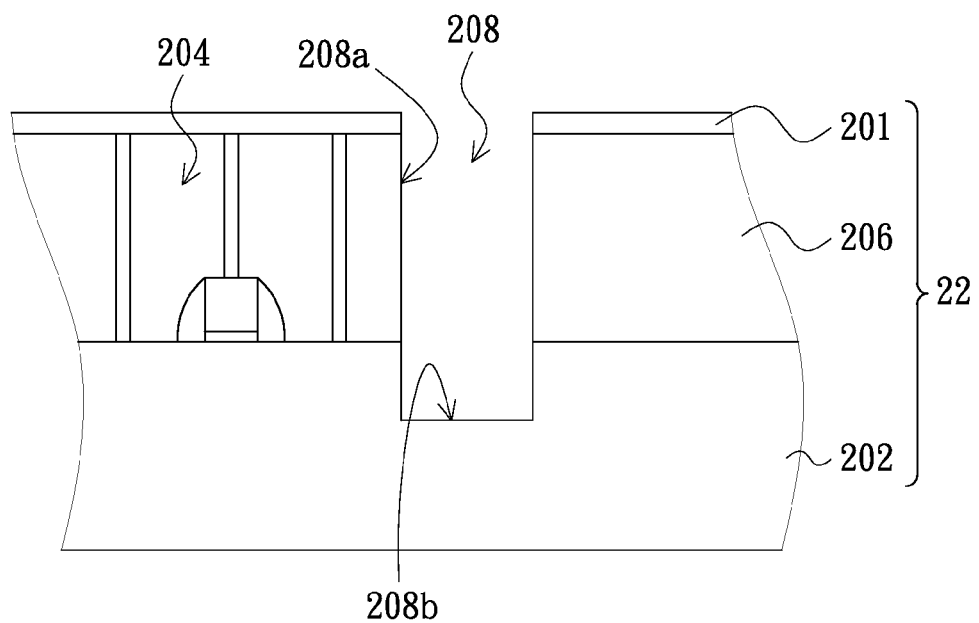

FIGS. 2A-2G illustrate cross sections of the process for manufacturing a TSV structure 216 in accordance with another embodiment of the present invention. Referring to FIG. 2A, a stack structure 22 having a silicon substrate 202, an ILD layer 206 and a dielectric stop layer 201 is provided. Wherein the ILD layer 206 is formed on the substrate 202, and the ILD layer 206 has at least one electronic devices 204, such as a conductive wire, a transistor, a diode, a resistor or a capacitor formed therein. The ILD layer 206 preferably is a low-k dielectric material or ultra low-k dielectric material consisting of SiN, SiCN, SiC, $SiO2$, USG, TEOS or the arbitrary combinations thereof; the dielectric stop layer 201 preferably consisting of SiN, SiCN, SiC or the arbitrary combinations thereof is formed on the ILD layer 206. An opening 208 is then formed in the stack structure 22. Referring to FIG. 2B, the opening 208 penetrates through the planarization stopping layer 201 and the ILD layer 206, and further extends into a portion of the substrate 202.

Figure 2C:
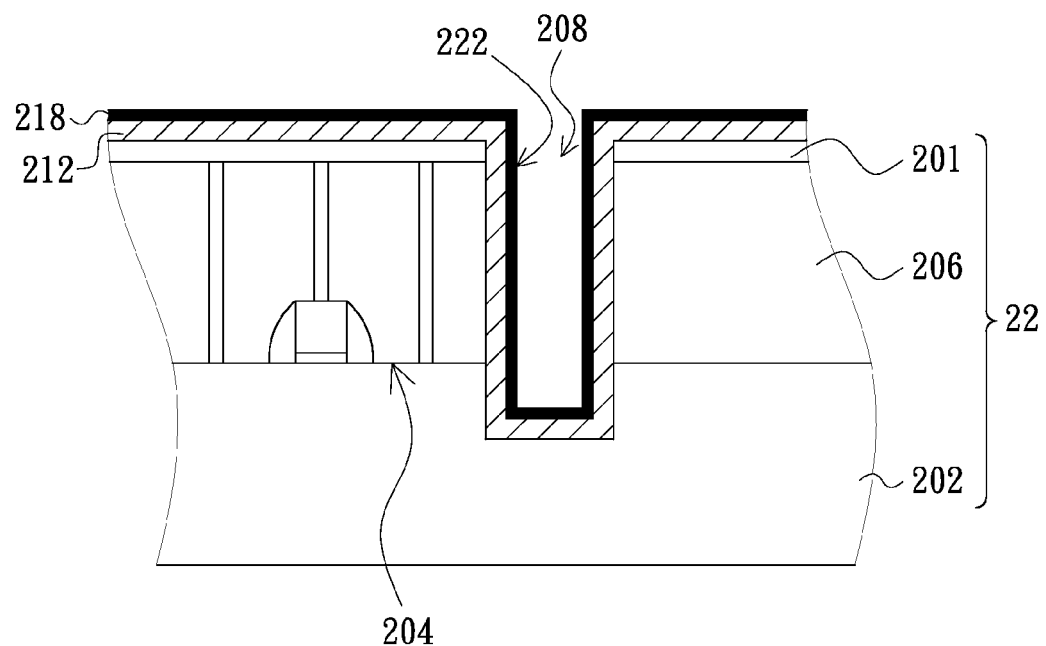

Subsequently, an insulator layer 212 and a metal barrier 218 are sequentially formed on the dielectric stop layer 201 and the sidewalls 208a and the bottom 208b of the opening 208 (shown as FIG. 2C). In the present embodiment, the insulator layer 212 consists of any electrical insolating material preferably comprises TEOS, and the metal barrier 218 consists of TiN, Ti, TaN or the arbitrary combinations thereof.

Figure 2D:
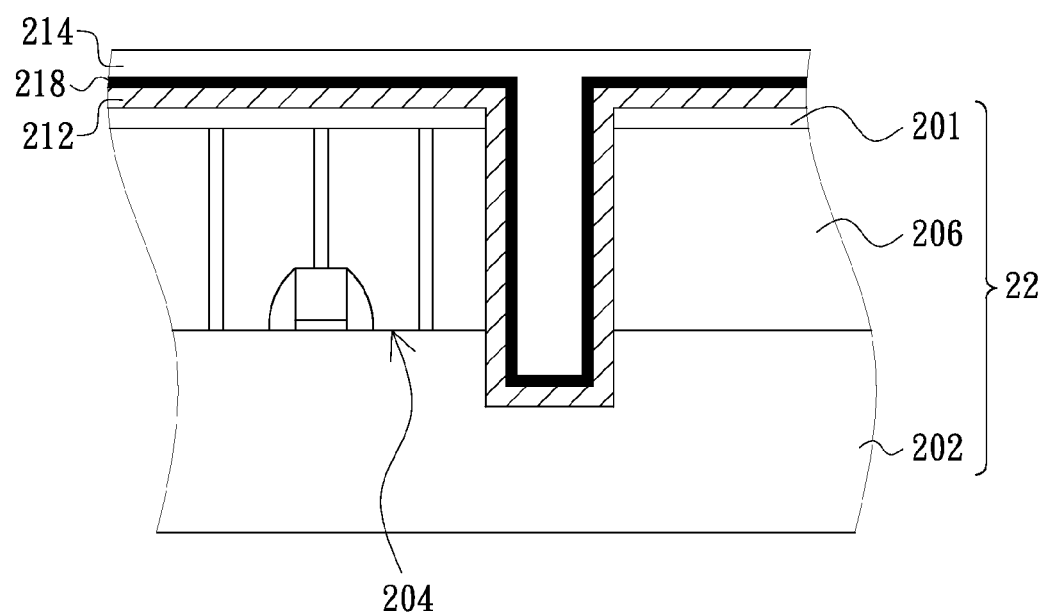
Figure 2E:
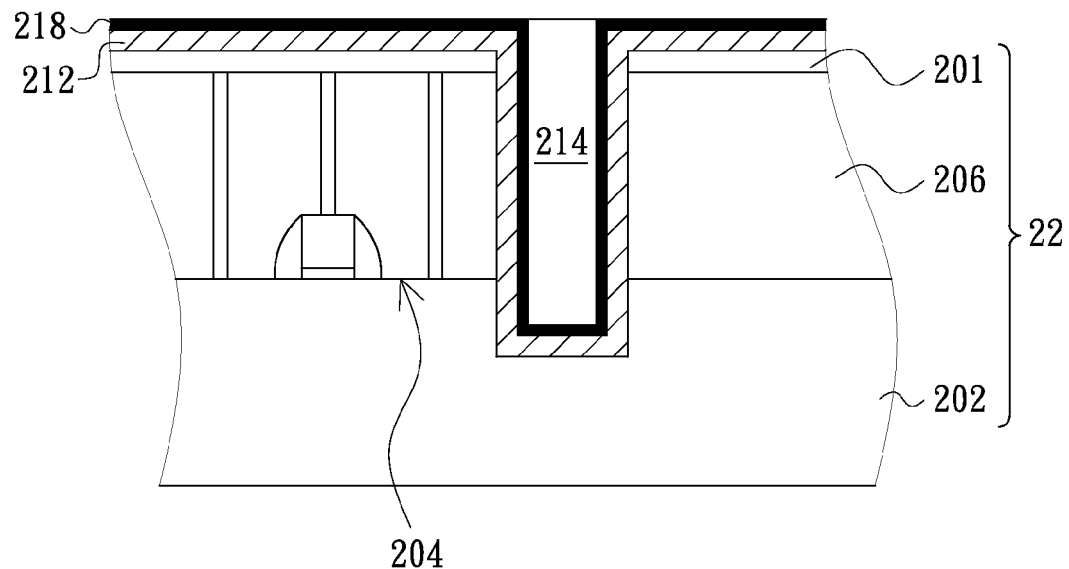
Figure 2F:
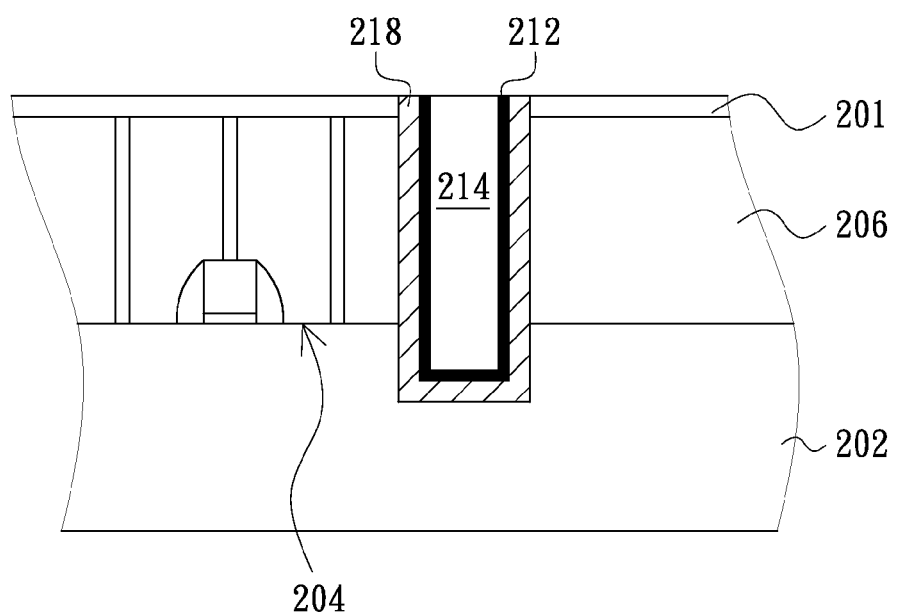
Figure 3:
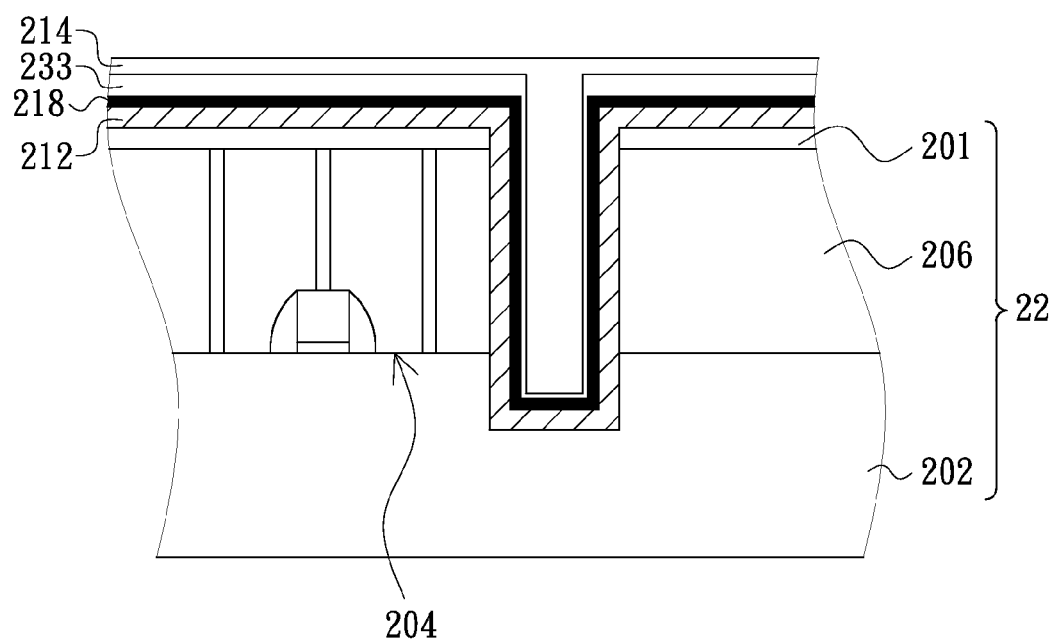
FIG. 3 illustrates a cross section view after a dielectric layer is provided on the metal barrier in accordance with further another embodiment of the present invention.

After that, a metal filling process, such as an electroplating process, is conducted on the stack structure 22 to fulfill the opening 208 with a metal, such as Cu or Al, and to form a top metal layer 214 on the metal barrier 218 (shown as FIG. 2D). In some embodiments of the present invention, a seeding deposition 222 may be conducted on the metal barrier 218 prior the metal filling process is conducted (shown as FIG. 2C). In another embodiments of the present invention, a dielectric layer 233, such as a TEOS layer, may be provided on the metal barrier 218 prior the metal filling process is conducted (shown as FIG. 3).

A first planarization process, for example a CMP process, is then conducted to remove the portion of the top metal layer 214 covering on the metal barrier 218 (shown as FIG. 2E), and the CMP process is then stopped on the metal barrier 218, wherein the slurry of the CMP process has different polishing rate for removing the metal barrier 218 and the top metal layer 214. In the present embodiment, the polishing rate for removing the metal barrier 218 is less than the polishing rate for removing the top metal layer 214. Preferably, the ratio of the polishing rate for removing top metal layer 214 to the polishing rate for removing the barrier layer 218 is greater than 2. In the present embodiment the ratio is about one hundred or more than one hundred.

After the first planarization process, a second planarization process, for example a second CMP process, is conducted to remove a portions of the metal barrier 218, a portions of the insulator layer 212 covering on the dielectric stop layer 201 and a portion of the top metal layer 214 (shown as FIG. 2F), and the second CMP process is then stopped on the dielectric stop layer 201, wherein the slurry of the second CMP process has different polishing rates for removing the dielectric stop layer 201 and the insulator layer 212. In the present embodiment, the polishing rate for removing the dielectric stop layer 201 is less than the polishing rate for removing the insulator layer 212. Besides, the polishing rate for removing the dielectric stop layer 201 is also less than each of the polishing rate for removing the metal barrier 218 and the top metal layer 214. Preferably, the ratio of the polishing rate for removing the insulator layer 212 to that for removing the dielectric stop layer 201 is substantially greater than 2.

Figure 2G:
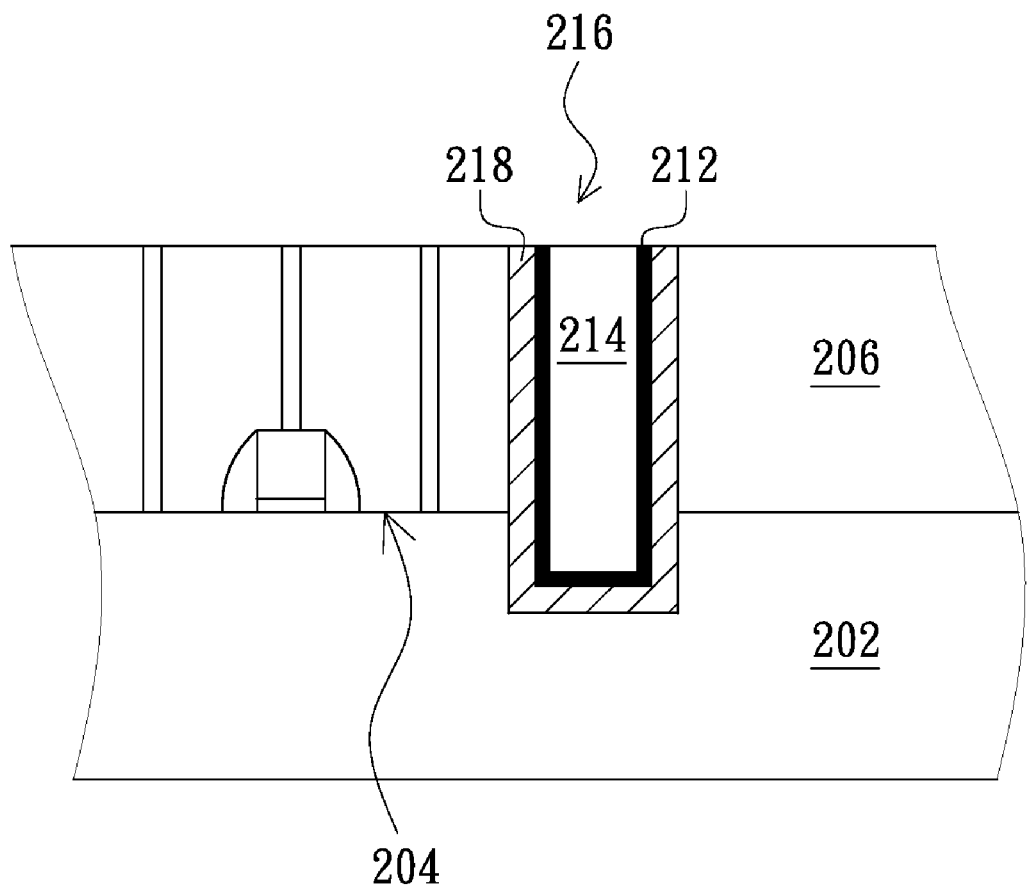

Subsequently, a third planarization process, for example a third CMP process, is conducted to remove the dielectric stop layer 201 and portions of the metal barrier 218, the insulator layer 212 and the top metal layer 214, to form the TSV 216 (shown as FIG. 2G).

In the present embodiment, the third CMP process is then stopped on the ILD layer 206, and the slurry of the third CMP process has a polishing rate for removing the dielectric stop layer 201 greater than that for removing the ILD layer 206. Preferably, the ratio of the polishing rate for removing the dielectric stop layer 201 to that for removing the ILD layer 206 is substantially greater than 2.

After the TSV 216 is formed, at least one ILD layer other than the ILD layer 206 is subsequently formed over the ILD layer 206 to form a 3D wafer package structure (not shown).

In accordance with the embodiments of the present invention, a planarization stopping layer is provide between a ILD layer and a top metal layer of a stack structure prior to a planarization process for forming a TSV, such that the planarization processes could be divided into several polishing stages. Generally, the polishing rate for removing the stop layer is always less than the polishing rate for removing the layer blanket over the strop layer. Preferably, the ratio of the polishing rate for removing the layer blanket over the strop layer to that for removing the strop layer is substantially greater than 2. In other words, the end-points and the polishing thickness of the planarization process can be well controlled by utilizing various polishing slurries having different polishing selectivity in associated with the ISRM technology. Accordingly, the polishing uniformity of the TSV and the processing reliability during the wafer level packaging process can be enhanced.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method for manufacturing a through-silicon via (TSV), the method comprising:
   providing a stack structure having a substrate, an internal layer dielectric (ILD) layer and a dielectric planarization stopping layer, wherein an opening is formed in the stack structure penetrating through the ILD layer, the dielectric planarization stopping layer and further extending into the substrate;
   providing an insulator layer and a metal barrier sequentially on the stack structure and the sidewalls of the opening;
   providing a top metal layer formed on the stack structure to fill the opening;
   conducting a first planarization process stopping on the metal barrier to remove a portion of the top metal layer, wherein the first planarization process has a polishing rate for removing the metal barrier less than that for removing the top metal layer;
   conducting a second planarization process stopping on the dielectric planarization stopping layer to remove portions of the top metal layer, the metal barrier and the insulator layer, wherein the second planarization process has a polishing rate for removing the insulator layer greater than that for removing the dielectric planarization stopping layer; and
   conducting a third planarization process stopping on the ILD layer to remove the dielectric planarization stopping layer and portions of the top metal layer, the metal barrier and the insulator layer, wherein the third planarization process has a polishing rate for removing the dielectric planarization stopping layer greater than that for removing the ILD layer.

2. The method of claim 1, wherein the dielectric planarization stopping layer consists of silicon nitride (SiN), silicon oxynitride (SiCN) or silicon carbide (SiC).

3. The method of claim 1, wherein the first planarization process comprises a chemical mechanical polishing (CMP) process having a polishing rate for removing the metal barrier less than a polishing rate for removing the top metal layer.

4. The method of claim 3, wherein the ratio of the polishing rate for removing the top metal layer to the polishing rate for removing the metal barrier is substantially greater than 2.

5. The method of claim 3, wherein the ratio of the polishing rate for removing the top metal layer to the polishing rate for removing the metal barrier is about one hundred or greater than one hundred.

6. The method of claim 1, wherein the second planarization process comprises a CMP processes having a polishing rate for removing the dielectric planarization stopping layer less than a polishing rate for removing the insulator layer.

7. The method of claim 6, wherein the ratio of the polishing rate for removing the insulator layer to the polishing rate for removing the dielectric planarization stopping layer is substantially greater than 2.

8. The method of claim 1, wherein the third planarization process comprises a CMP process having a polishing rate for removing the dielectric planarization stopping layer greater than a polishing rate for removing the ILD layer.

9. The method of claim 8, wherein the ratio of the polishing rate for removing the dielectric planarization stopping layer to the polishing rate for removing the ILD layer is substantially greater than 2.

10. The method of claim 1, before the top metal layer is filled in the opening further comprises conducting a seeding deposition on the metal barrier.

11. A method for manufacturing a semiconductor device, the method comprising:
    providing a stack structure having a substrate, an ILD layer, wherein an opening is formed in the stack structure penetrating through the ILD and further extending into the substrate;
    providing a insulator layer and a metal barrier sequentially on the stack structure and the sidewalls of the opening;
    providing a top metal layer formed on the stack structure to fill the opening;
    conducting a first planarization process stopping on the metal barrier to remove a portion of the top metal layer, wherein the first planarization process has a polishing rate for removing the metal barrier less than that for removing the top metal layer;

conducting a second planarization process stopping on the insulator layer to remove portions of the top metal layer and the metal barrier, wherein the second planarization process has a polishing rate for removing the metal barrier greater than that for removing the insulator layer; and conducting a third planarization process stopping on the ILD layer to remove portions of the top metal layer, the metal barrier and the insulator layer, wherein the third planarization process has a polishing rate for removing the insulator layer greater than that for removing the ILD layer.

12. The method of claim 11, wherein the first planarization process comprises a CMP process having a polishing rate for removing the barrier layer less than a polishing rate for removing the top metal layer.

13. The method of claim 12, wherein the ratio of the polishing rate for removing the top metal layer to the polishing rate for removing the metal barrier is substantially greater than 2.

14. The method of claim 13, wherein the ratio of the polishing rate for removing the top metal layer to the polishing rate for removing the metal barrier is about one hundred or greater than one hundred.

15. The method of claim 11, wherein the second planarization process comprises a CMP processes having a polishing rate for removing the insulator layer less than a polishing rate for removing the metal barrier.

16. The method of claim 15, wherein the ratio of the polishing rate for removing the metal barrier to the polishing rate for removing the insulator layer is substantially greater than 2.

17. The method of claim 11, wherein the third planarization process comprises a CMP process having a polishing rate for removing the insulator layer greater than a polishing rate for removing the ILD layer.

18. The method of claim 17, wherein the ratio of the polishing rate for removing the insulator layer to the polishing rate for removing the ILD layer is substantially greater than 2.

19. The method of claim 11, before the top metal layer is filled into the opening further comprises conducting a seeding deposition on the barrier layer.

* * * * *